United States Patent
Li et al.

(10) Patent No.: US 9,635,776 B2
(45) Date of Patent: Apr. 25, 2017

(54) CABINET

(71) Applicants: HONG FU JIN PRECISION INDUSTRY (ShenZhen) CO., LTD., Shenzhen (CN); HON HAI PRECISION INDUSTRY CO., LTD., New Taipei (TW)

(72) Inventors: Han-Yu Li, New Taipei (TW); Guang-Dong He, Shenzhen (CN)

(73) Assignees: HONG FU JIN PRECISION INDUSTRY (ShenZhen) CO., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 70 days.

(21) Appl. No.: 14/546,663

(22) Filed: Nov. 18, 2014

(65) Prior Publication Data

US 2015/0313036 A1 Oct. 29, 2015

(30) Foreign Application Priority Data

Apr. 25, 2014 (CN) .......................... 2014 1 0170041

(51) Int. Cl.
*H05K 7/00* (2006.01)
*H05K 7/14* (2006.01)

(52) U.S. Cl.
CPC .................................. *H05K 7/1489* (2013.01)

(58) Field of Classification Search
None
See application file for complete search history.

(56) References Cited

U.S. PATENT DOCUMENTS

| | | | | |
|---|---|---|---|---|
| 5,332,306 A * | 7/1994 | Babb | .................... | H05K 7/1418 312/223.1 |
| 5,774,343 A * | 6/1998 | Benson | .................... | H05K 7/16 211/150 |
| 5,995,364 A * | 11/1999 | McAnally | ............... | G06F 1/187 361/679.31 |
| 6,078,504 A * | 6/2000 | Miles | ...................... | G06F 1/184 174/17 CT |
| 6,111,195 A * | 8/2000 | Hand | ..................... | A47B 47/02 174/495 |
| 6,398,325 B1 * | 6/2002 | Chen | ....................... | G06F 1/181 292/128 |
| 6,507,487 B1 * | 1/2003 | Barina | .................... | G06F 1/187 312/236 |
| 6,529,373 B1 * | 3/2003 | Liao | ........................ | G06F 1/187 211/26 |
| 6,530,551 B2 * | 3/2003 | Gan | ........................ | G06F 1/184 248/694 |

(Continued)

*Primary Examiner* — Courtney Smith
*Assistant Examiner* — Rashen E Morrison
(74) *Attorney, Agent, or Firm* — Steven Reiss

(57) ABSTRACT

A cabinet for installing first servers or second servers different than the first servers in size, and the cabinet includes a frame and four adjusting assemblies respectively installed to four corners of the frame. Each adjusting assembly includes a first mounting bracket fixed to the frame and a second mounting bracket rotatably connected to the first bracket. When the second bracket is rotated to being received in the first bracket, the first servers can be installed to the first bracket. When the second bracket is rotated away from the first bracket, the second servers can be installed to the second bracket.

8 Claims, 8 Drawing Sheets

(56) References Cited

U.S. PATENT DOCUMENTS

| | | | | |
|---|---|---|---|---|
| 6,535,391 B2* | 3/2003 | Larsen | G06F 1/187 | 312/223.1 |
| 6,826,044 B2* | 11/2004 | Gan | G06F 1/187 | 361/679.58 |
| 6,826,055 B2* | 11/2004 | Mease | G06F 1/184 | 312/223.1 |
| 6,879,484 B2* | 4/2005 | Chou | G06F 1/184 | 361/679.02 |
| 6,882,527 B2* | 4/2005 | Wang | G06F 1/187 | 312/223.2 |
| 7,042,721 B2* | 5/2006 | Olesiewicz | G06F 1/187 | 312/223.2 |
| 7,102,886 B2* | 9/2006 | Peng | G06F 1/181 | 211/26 |
| 7,264,321 B1* | 9/2007 | Bueley | A47B 47/02 | 312/257.1 |
| 7,423,870 B2* | 9/2008 | Carlisi | H05K 7/1489 | 280/47.26 |
| 7,529,097 B2* | 5/2009 | Coglitore | H05K 7/1488 | 211/153 |
| 7,639,486 B2* | 12/2009 | Champion | G06F 1/183 | 211/26 |
| 7,643,280 B2* | 1/2010 | Chen | G11B 33/123 | 361/679.33 |
| 7,724,543 B2* | 5/2010 | Ozawa | H04Q 1/02 | 361/729 |
| 7,848,091 B2* | 12/2010 | Han | G06F 1/1616 | 361/679.26 |
| 7,864,514 B2* | 1/2011 | Lee | F16M 11/046 | 248/602 |
| 7,952,866 B2* | 5/2011 | Lee | G06F 1/1616 | 345/1.1 |
| 8,379,377 B2* | 2/2013 | Walters | G06F 1/1641 | 248/917 |
| 8,662,317 B2* | 3/2014 | Liang | H05K 7/1489 | 211/189 |
| 8,681,486 B2* | 3/2014 | Singhal | G06F 1/1649 | 248/917 |
| 8,817,461 B2* | 8/2014 | Chen | G06F 1/187 | 248/229.22 |
| 9,030,379 B2* | 5/2015 | Xu | G06F 1/1647 | 345/1.3 |
| 9,282,658 B1* | 3/2016 | Tsai | G11B 33/124 | |
| 2003/0202321 A1* | 10/2003 | Lin | G06F 1/187 | 361/679.33 |
| 2003/0210530 A1* | 11/2003 | Powell | H04R 1/026 | 361/727 |
| 2005/0068720 A1* | 3/2005 | Lambert | G06F 1/187 | 361/679.03 |
| 2005/0122675 A1* | 6/2005 | Cheng | G06F 1/18 | 361/679.39 |
| 2005/0286235 A1* | 12/2005 | Randall | H05K 7/1492 | 361/724 |
| 2009/0045713 A1* | 2/2009 | Kunkle | A47B 88/04 | 312/402 |
| 2011/0011817 A1* | 1/2011 | Yamakawa | A47B 67/04 | 211/153 |
| 2011/0095662 A1* | 4/2011 | Wang | G06F 1/181 | 312/223.1 |
| 2011/0180497 A1* | 7/2011 | Zhang | H05K 7/1489 | 211/26 |
| 2011/0279956 A1* | 11/2011 | Sun | H05K 7/1489 | 361/679.02 |
| 2012/0211447 A1* | 8/2012 | Anderson | G02B 6/4452 | 211/26 |
| 2013/0162125 A1* | 6/2013 | Liang | H05K 7/1489 | 312/223.2 |
| 2013/0163167 A1* | 6/2013 | Liao | G06F 1/181 | 361/679.02 |
| 2013/0308264 A1* | 11/2013 | Zhou | G11B 33/02 | 361/679.33 |
| 2013/0316555 A1* | 11/2013 | Han | H01R 13/56 | 439/135 |
| 2014/0055959 A1* | 2/2014 | Manda | G11B 33/128 | 361/728 |
| 2014/0159554 A1* | 6/2014 | Liu | H05K 7/1488 | 312/223.2 |
| 2015/0028729 A1* | 1/2015 | Frattaruolo | H05K 5/02 | 312/223.1 |
| 2015/0313036 A1* | 10/2015 | Li | H05K 7/1489 | 312/223.2 |
| 2016/0047160 A1* | 2/2016 | Huynh | E05F 15/77 | 49/31 |
| 2016/0113398 A1* | 4/2016 | Chang | A47B 88/04 | 312/333 |

* cited by examiner

CABINET

FIELD

The subject matter herein generally relates to a cabinet, for receiving different size servers.

BACKGROUND

Cabinets are designed for receiving similar size servers.

BRIEF DESCRIPTION OF THE DRAWINGS

Implementations of the present technology will now be described, by way of example only, with reference to the attached figures.

DETAILED DESCRIPTION

Figure 1:
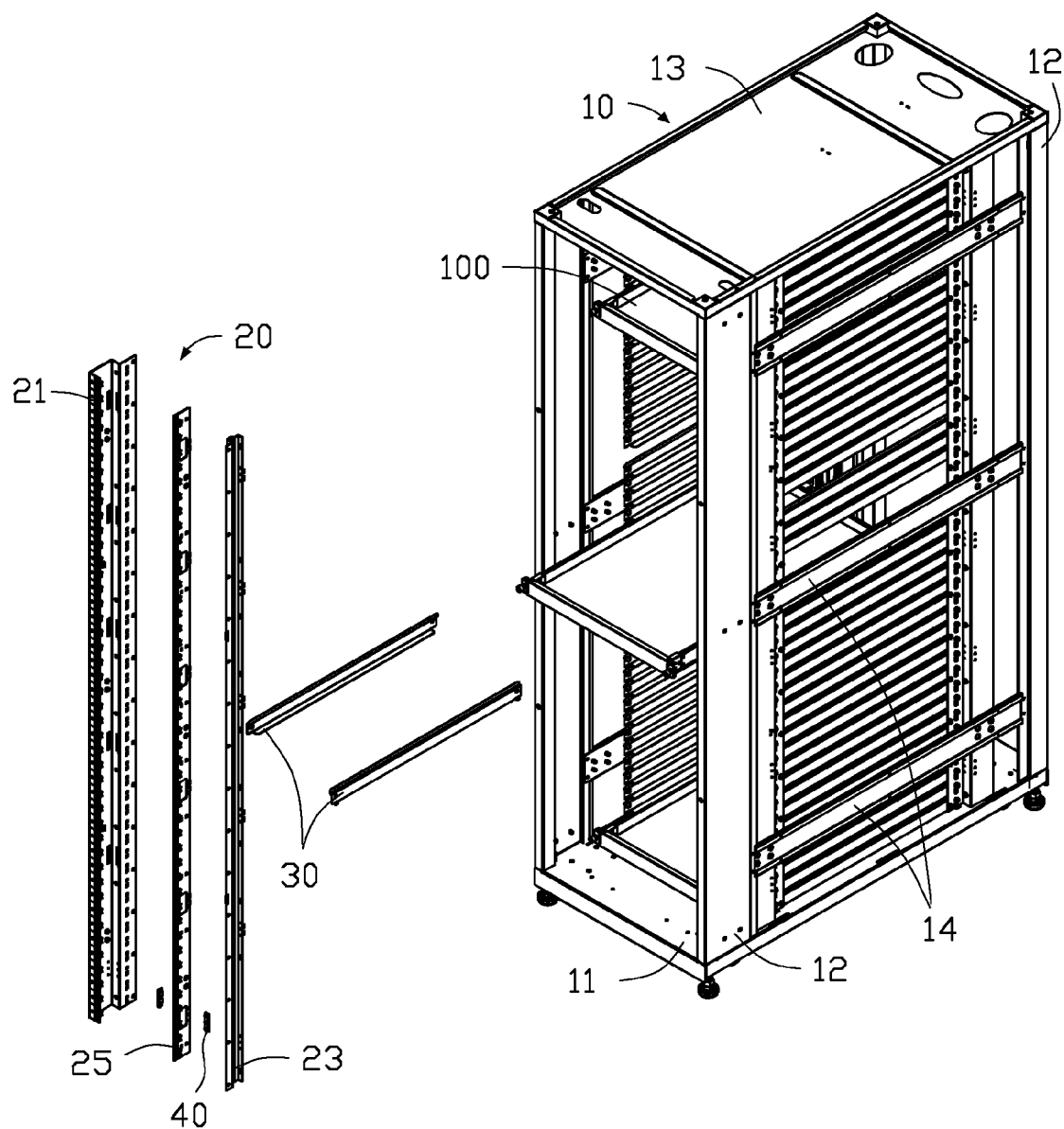
FIG. 1 is an exploded, isometric view of an embodiment of a cabinet, the cabinet comprises a frame, four adjusting assemblies, and a number of pairs of rails.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series and the like.

The present disclosure is described in relation to a cabinet.

Figure 7:
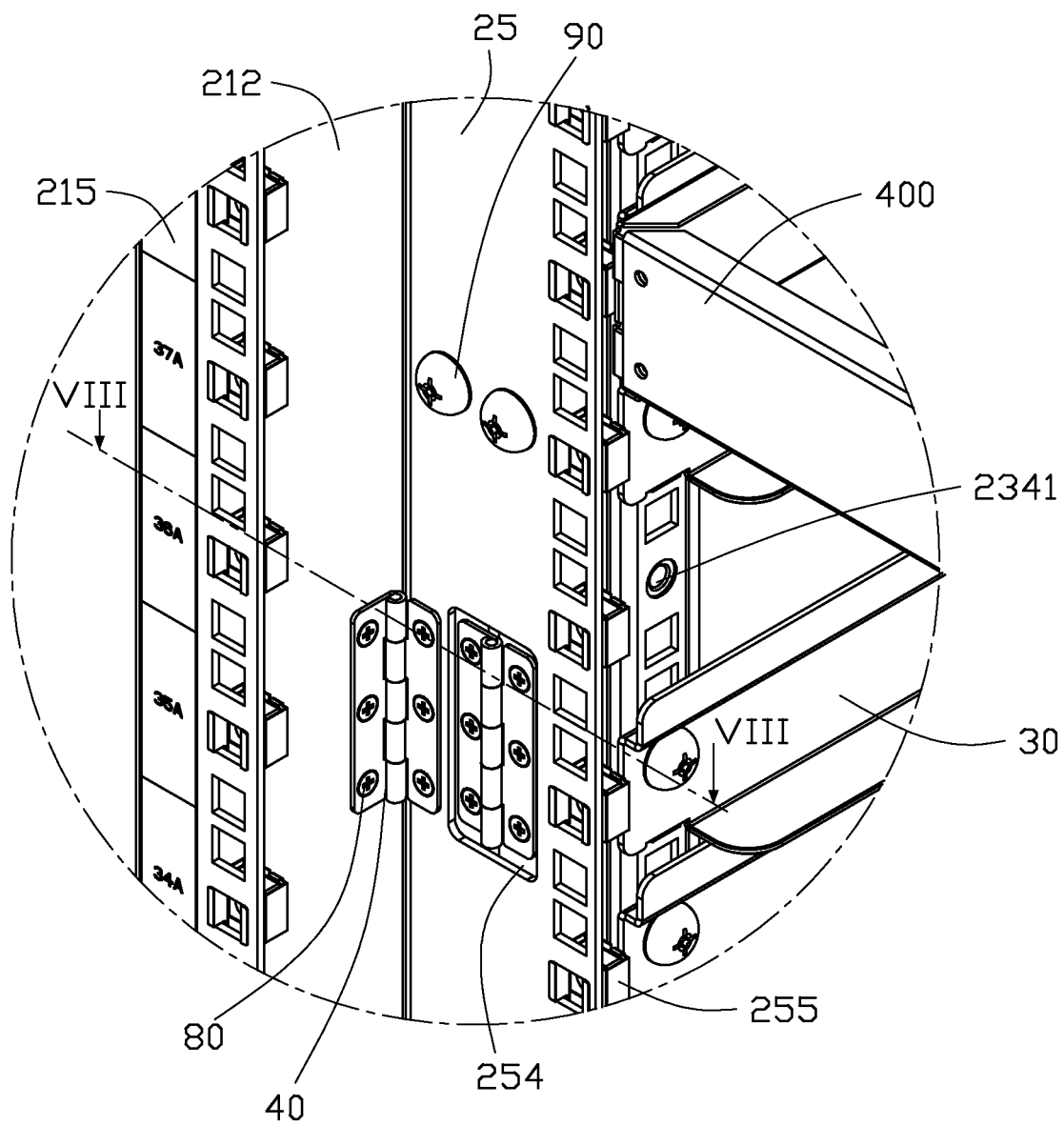
FIG. 7 is similar to FIG. 5, showing the cabinet in a second working state.

FIG. 1 illustrates an embodiment of a cabinet, for selectively receiving first servers 300 (shown in FIG. 5) and second servers 400 (shown in FIG. 7). The first and second servers 300, 400 have a first and second size consecutively. In the embodiment, a width of the first server 300 is wider than a width of the second server 400. The cabinet comprises a frame 10, two pairs of adjusting assemblies 20 respectively installed on four corners of the frame 10, and a plurality of rails 30. The frame 10 comprises a rectangular base 11, four posts 12 respectively extending up from four corners of the base 11, a panel 13 covering the four posts 12, and a plurality of beams 14 installed on each post 12 located on a same side or an opposite side of each post 12. Each adjusting assembly 20 comprises a first mounting bracket 21, a second mounting bracket 23, a connecting member 25, a plurality of buckling members 26, and a pair of hinges 40.

Figure 2:
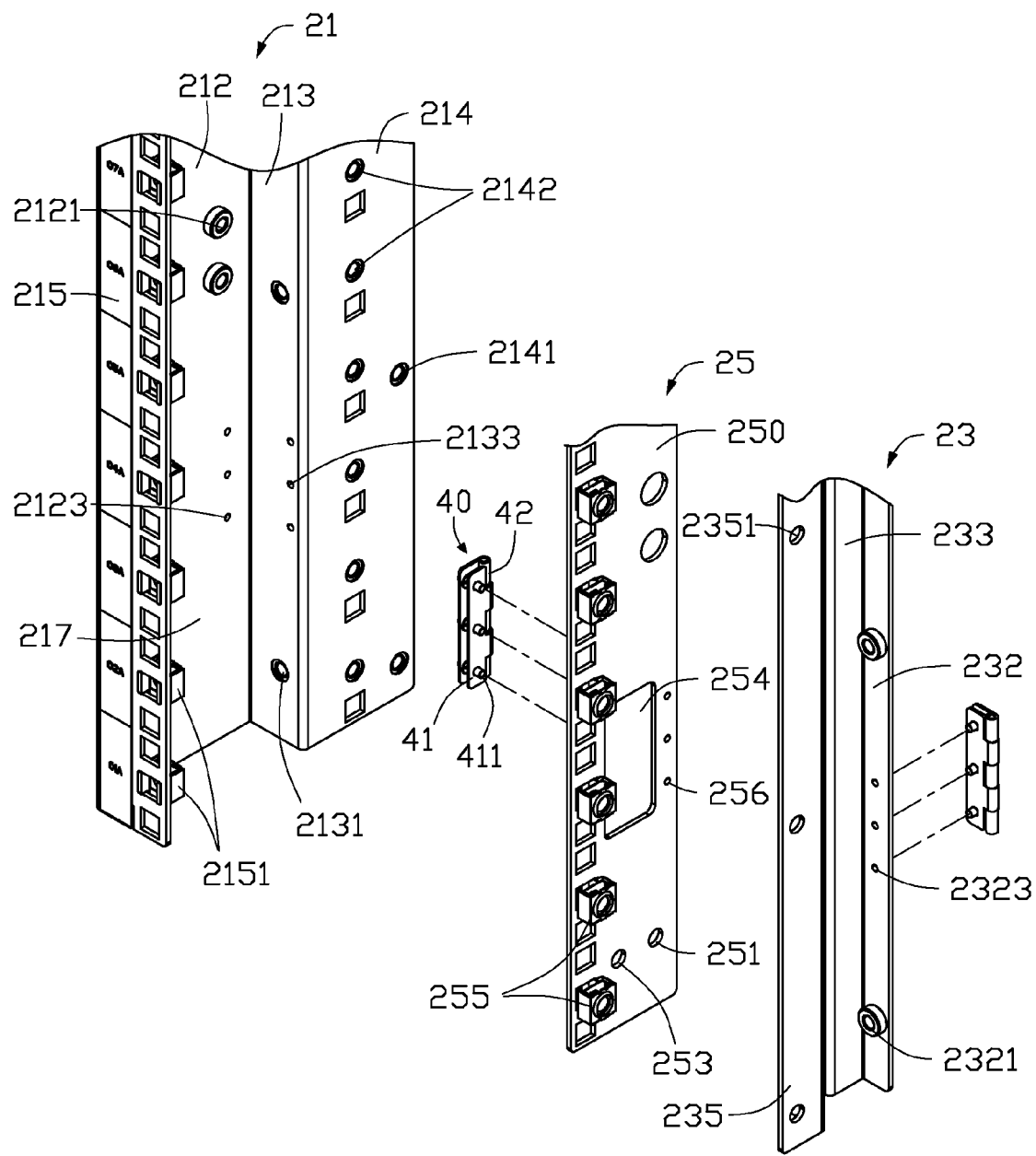
FIG. 2 is an enlarged view of an adjusting assembly of FIG. 1.

FIG. 2 illustrates an enlarged view of an adjusting assembly 20. The first mounting bracket 21 comprises a rectangular base board 212, a first connecting board 213 and a second connecting board 215 perpendicularly extending from two opposite side edges of the base board 212, respectively, a mounting board 214 perpendicularly extending outward from a side edge of the first connecting board 213 away from the base board 212. A plurality of posts perpendicularly extend from the base board 212 each axially defining a fixing hole 2121 extending through the base board 212. A plurality of fixing holes 2123 is longitudinally defined in the base board 212, aligning perpendicular with the first connecting board 213. The first connecting board 213 defines a plurality of positioning holes 2131 and a plurality of fixing holes 2133. The plurality of fixing holes 2133 is longitudinally defined in the first connecting board 213, neighboring the mounting board 214 and corresponding to the fixing holes 2123. A plurality of first mounting holes 2142 is longitudinally defined in a middle of the mounting board 214. A plurality of positioning holes 2141 is longitudinally defined in the mounting board 214, beside the first mounting holes 2142 and away from the first connecting board 213. A plurality of positioning caps 2151 longitudinally extends from an inside wall of the second connecting board 215. The base board 212, the first connecting board 213 and the second connecting board 215 cooperatively define a receiving space 217.

Figure 3:
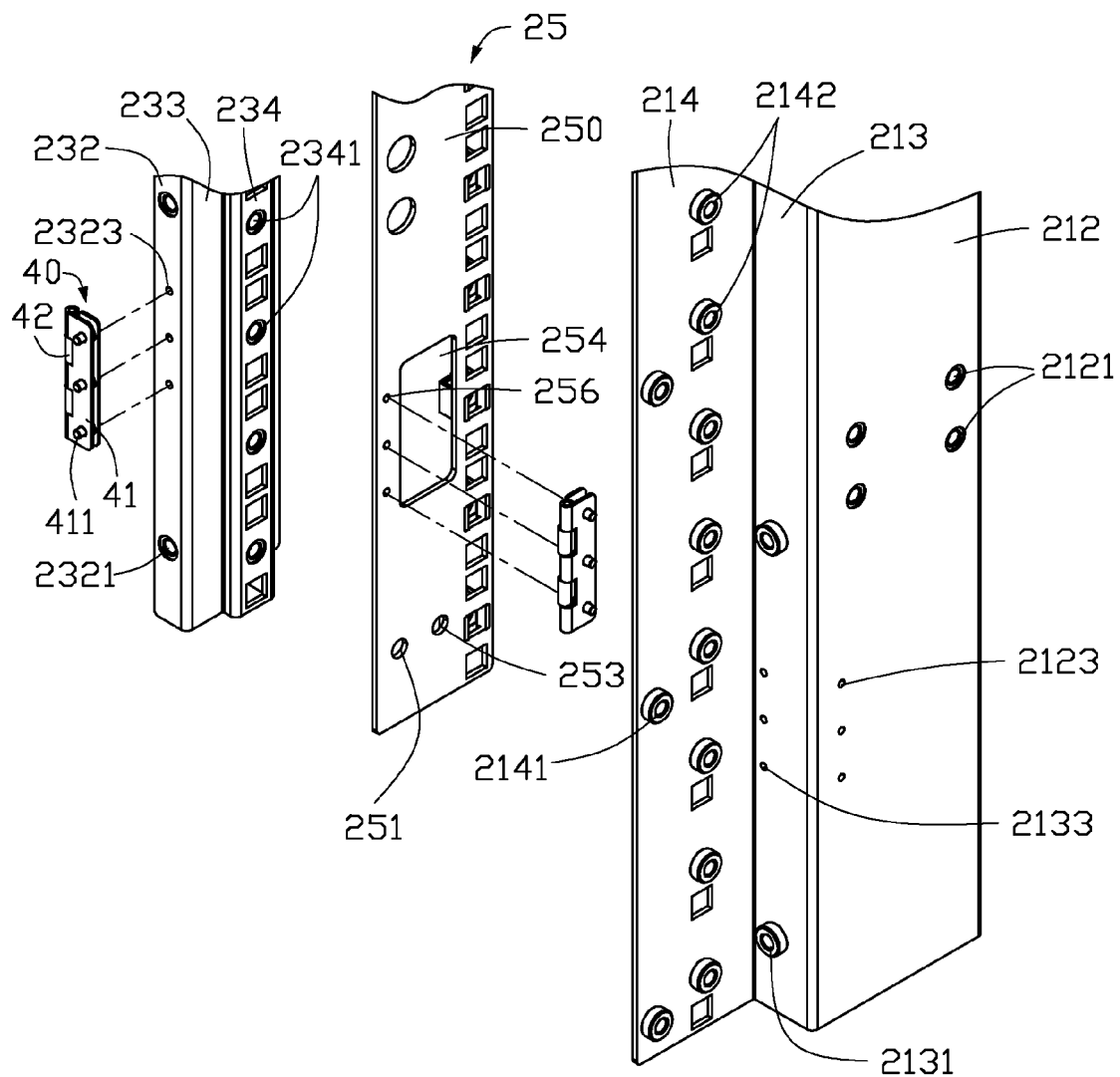
FIG. 3 is an inverted view of FIG. 2.

FIG. 3 illustrates an inverted view of FIG. 2. The second mounting bracket 23 comprises a rectangular base plate 234, a first L-shaped connecting plate 233 and a second L-shaped connecting plate 235 perpendicularly extending from two opposite side edges of the base plate 234 in opposite directions, with a mounting plate 232 extending from the first connecting plate 233. The mounting plate 232 extends in a direction perpendicular to the first connecting plate 233 and away from the mounting plate 232. The mounting plate 232 comprises a plurality of posts extending longitudinally and defining a positioning hole 2321 axially, and a plurality of fixing holes 2323. The second connecting plate 235 longitudinally defines a plurality of through holes 2351. A plurality of second mounting holes 2341 is longitudinally defined in the base plate 234.

The connecting member 25 is substantially a rectangular board 250 and centrally defines a plurality of longitudinal rectangular openings 254. A plurality of positioning caps 255 extend from the board 250, nearing an edge of the board 250. A pair of through holes 251 is defined in the board 250 below each opening 254. A plurality of fixing holes 256 is longitudinally defined in the board 250, nearing an opposite edge of the board 250.

Figure 6:
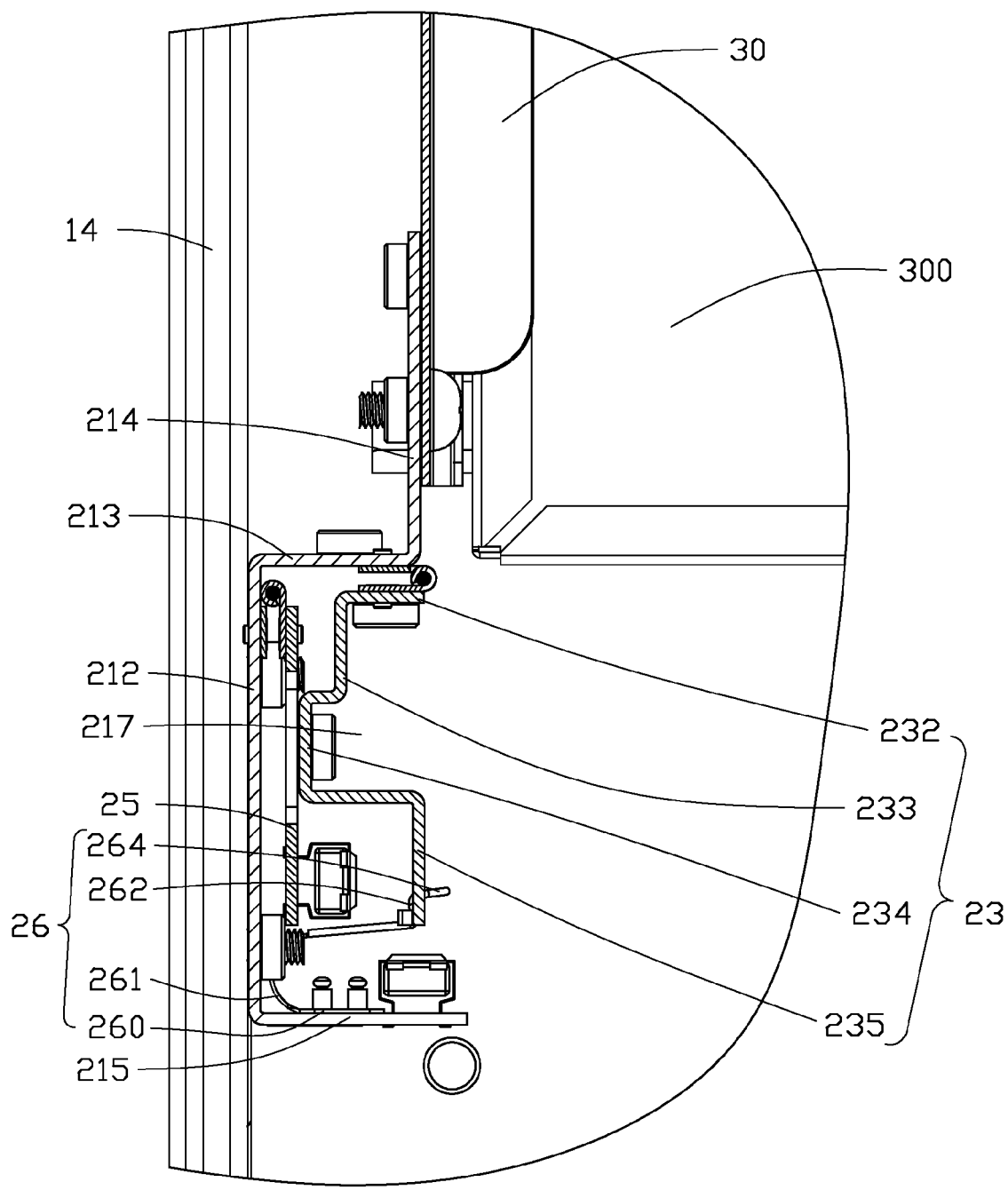
FIG. 6 is a cross sectional view taken along line VI-VI of FIG. 5.

FIG. 6 illustrates that the buckling member 26 is a curved resilient tab and comprises a fixing portion 260 fixed on the inner side of the second connecting board 215, an arc-shaped flexible portion 261 extending inward from an inner end of the fixing portion 260, a L-shaped buckling portion 262 extending outward then forward from a free end of the flexible portion 261, and a handle 264 extending outward from an free end of the buckling portion 262. The buckling member 26 can be operated to buckle the second mounting bracket 23.

Each of the hinges 40 comprises two fixing sheets 41 and a shaft 42. The two fixing sheets 41 are rotatably attached to the shaft 42. Each of the fixing sheets 41 longitudinally defines a plurality of through holes 411.

Figure 4:
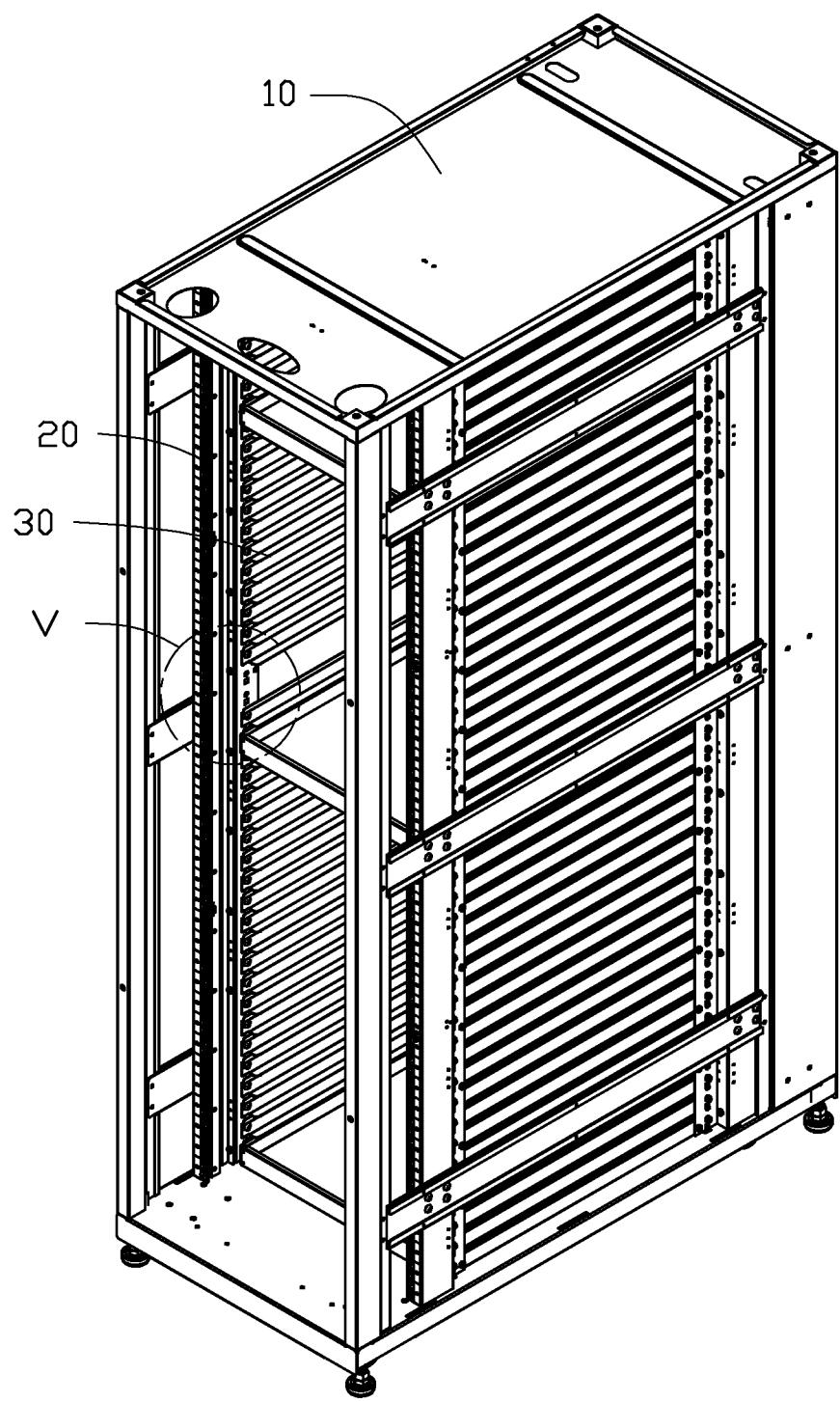
FIG. 4 is an assembled, isometric view of the cabinet of FIG. 1.

FIG. 4 illustrates an assembled, isometric view of the cabinet of FIG. 1. Two fixing sheets 41 of one hinge 40 can be placed adjacent to the base board 212 and the connecting member 25, with the positioning caps 255 distant from the hinge 40. A plurality of fasteners 80 (shown in FIG. 6) can extend through the through holes 411 to engage in the corresponding fixing holes 2123 and 256, for rotatably attaching the base board 212 to the connecting member 25. Two fixing sheets 41 of another hinge 40 can be placed adjacent to the first connecting board 213 and the mounting plate 232. A plurality of fasteners 80 can extend through the through holes 411 to engage in the corresponding fixing holes 2133 and 2323, for rotatably attaching the first connecting board 213 to the first connecting plate 233. Then, the second mounting bracket 23 can be rotated relative to the first mounting bracket 21. The fixing portion 260 of the buckling member 26 can be fixed to the second connecting board 215. A pair of adjusting assemblies 20 is oppositely mounted in the front of the frame 10 and another pair of adjusting assemblies 20 is oppositely mounted in the rear of the frame 10, with the second connecting boards 215 perpendicular to the beams 14. A plurality of fasteners 90 (shown in FIG. 5) can extend through two ends of each beam 14 to engage in the corresponding fixing holes 2121, for fastening the four adjusting assemblies 20 to the frame 10. A plurality of fasteners 90 can extend through the rails 30 to engage in the first mounting holes 2142, for fastening the rails 30 to the first mounting brackets 21.

Figure 5:
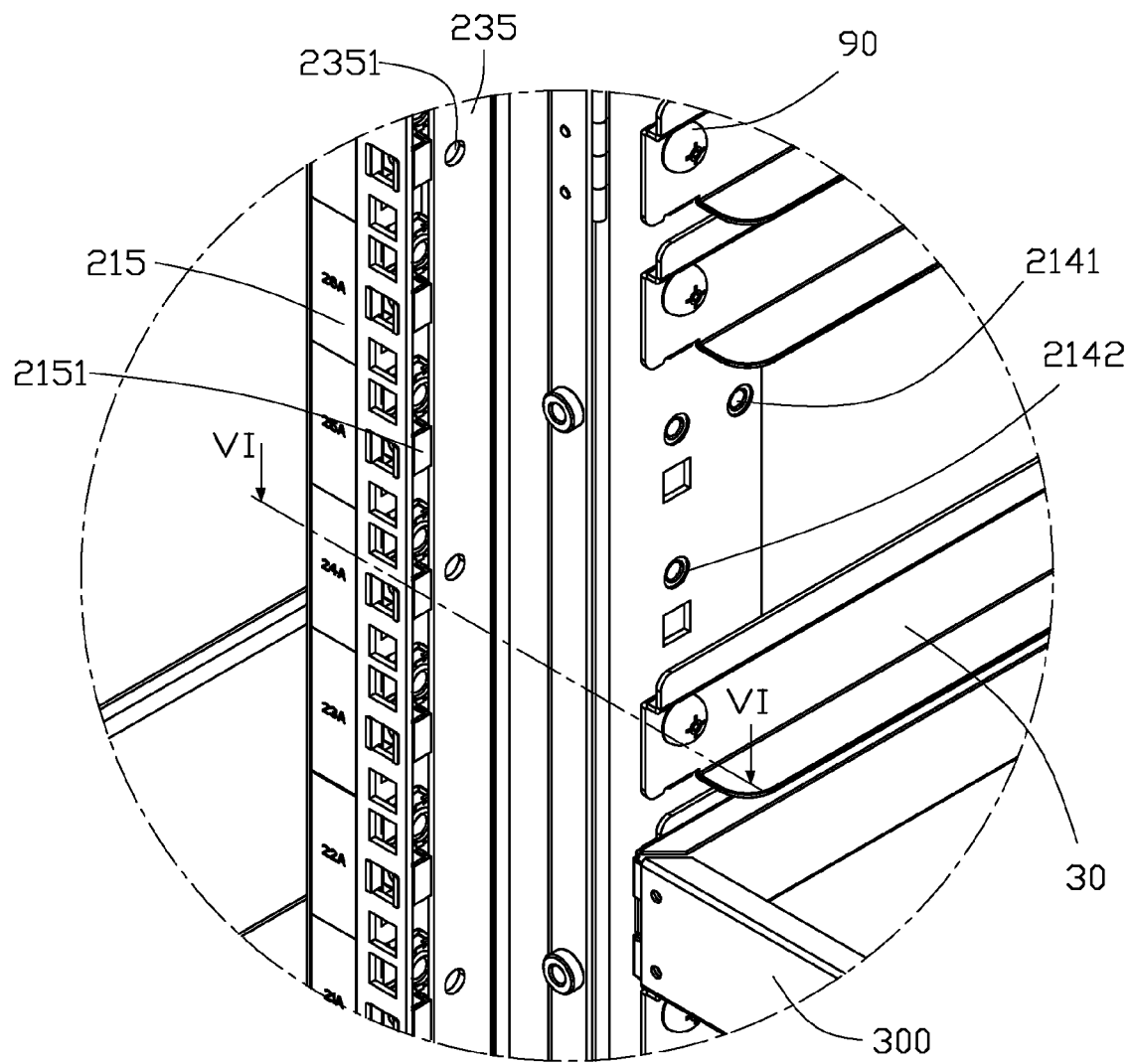
FIG. 5 is an enlarged view of a circle portion V of FIG. 4, showing the cabinet in a first working state.

FIGS. 5 and 6 illustrate when the cabinet is in a first working state, the second mounting bracket 30 and the connecting member 25 are rotated to be received in the receiving space 217. The buckling portion 262 can buckle the second connecting plate 235 on an outer surface, keeping the connecting member 25 and the second mounting bracket 23 fixed in the receiving space 217. At this time, the connecting member 25 is parallel to the base board 212 and an outer surface of the base plate 234 contacts the connecting member 25 and faces the base board 212. A plurality of fasteners 90 can extend through the rails 30 to engage in the first mounting holes 2142, fastening the rails 30 to the first mounting bracket 21. The first servers 300 can be slid into the frame 10 along corresponding pair of the rails 30.

Figure 8:
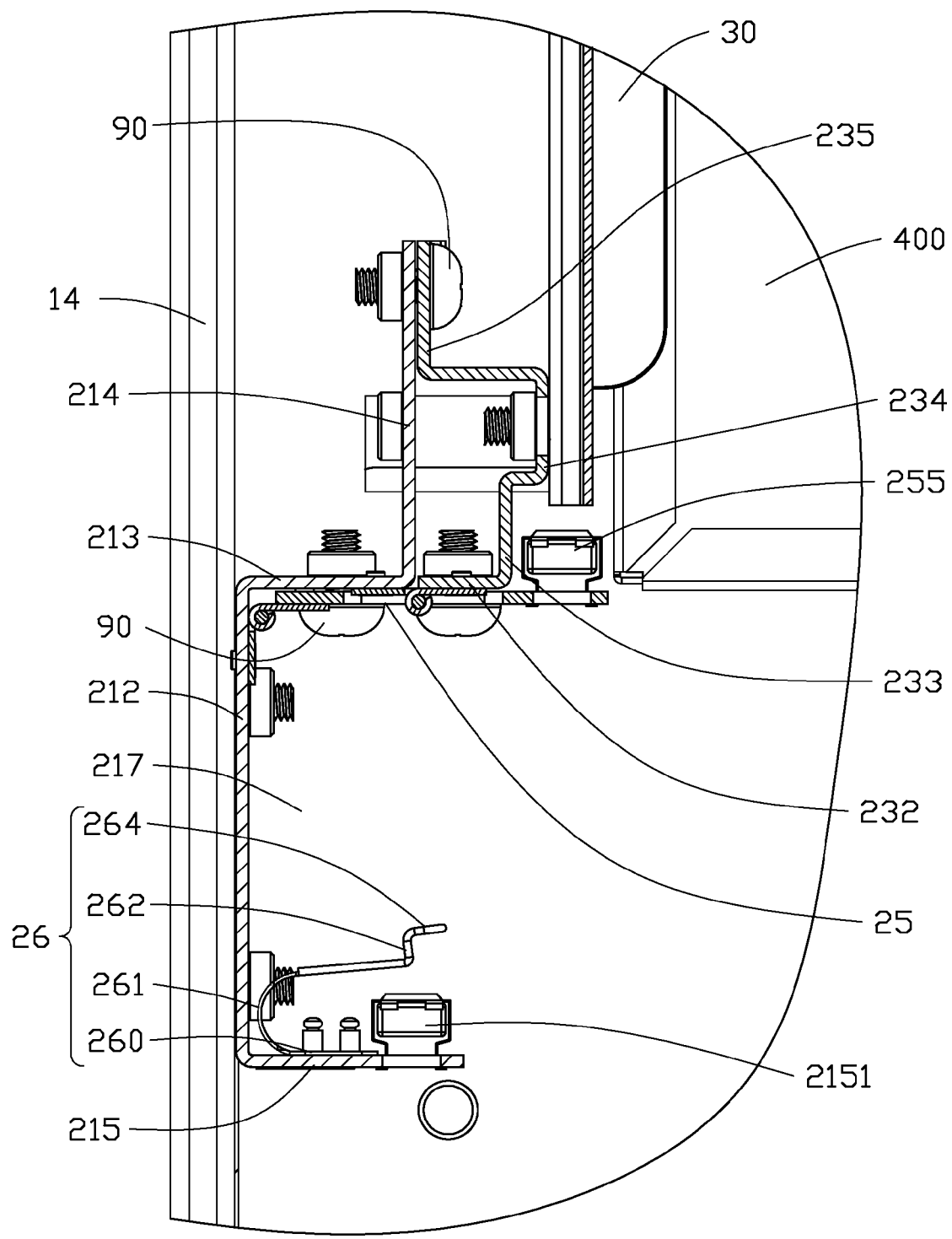
FIG. 8 is a cross sectional view taken along line VIII-VIII of as FIG. 7.

FIGS. 7 and 8 illustrate when the cabinet is in a second working state, the first servers 300 and the rails 30 can be detached from the frame 10. The buckling member 26 can be deformed to release the handle 264 from the second connecting board 215. The second mounting bracket 23 and the connecting member 25 can be rotated out of the receiving space 217. The connecting member 25 is perpendicular to the base board 212, and contacts the first connecting board 213 and the mounting plate 232. An inside surface of the base board 234 faces the mounting board 214. A plurality of fasteners 90 can extend through the through holes 2351 of the second connecting plate 235 to engage in the corresponding positioning holes 2141 of mounting board 214, for fastening the second mounting bracket 23 to the first mounting bracket 21. The openings 254 can receive the corresponding hinges 40. A plurality of fasteners 90 can extend through the through holes 251 and 253 to engage in the corresponding positioning holes 2131 and 2321, for fastening the connecting member 25 to the second mounting bracket 23 and the first mounting bracket 21. A plurality of fasteners 90 can extend through the rails 30 to engage in the second mounting holes 2341, for fastening the rails 30 to the second mounting bracket 23. The second servers 400 can be slid into the frame 10 along the rails 30.

In the embodiment, the fixing holes 2121, 2123, 2133, 2323, 256, and 411 can be screw holes. The first mounting holes 2131, the second mounting holes 2141, the positioning holes 2321 can be screw holes. The fasteners 80 and 90 can be screws.

In another embodiment, each adjusting assembly 20 can comprises two or more second mounting brackets 23 and connecting members 25 rotatably attached to the first mounting bracket 21 in a vertical alignment. Some of the second mounting brackets 23 and the connecting members 25 can be rotated out of the receiving spaces 217 to receive the servers 400 between the corresponding second mounting brackets and some of the second mounting brackets 23 and the connecting members 25 can be rotated to be received in the receiving spaces 217 to receive the servers 300 between the corresponding first mounting brackets 21.

The embodiments shown and described above are only examples. Many details are well known by those in the art therefore, many such details are neither shown nor described. Even though numerous characteristics and advantages of the present technology have been set forth in the foregoing description, together with details of the structure and function of the present disclosure, the disclosure is illustrative only, and changes may be made in the details, especially in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. A cabinet for selectively installing one of a first server and a second server, the first server having a first size, the second server having a second size, the second size being different from the first size, the cabinet comprising:
  a frame; and
  a pair of adjusting assemblies each mounted on opposite surfaces of the front of the frame and another pair of adjusting assemblies each mounted on opposite surfaces of the rear of the frame, each adjusting assembly comprising a first mounting bracket and a second mounting bracket rotatably connecting with the first mounting bracket, the first mounting bracket comprising a receiving space defined therein;
  wherein, when the second mounting bracket is rotated to be received in the receiving space of the first mounting bracket in a first position, the first server is received between the corresponding first mounting brackets; and when the second mounting bracket is rotated out of the receiving space to a second position, the second server is received between the corresponding second mounting bracket;
  wherein each first mounting bracket comprises a rectangular base board, a first connecting board, a second connecting board, and a mounting board, the second connecting board perpendicularly extends, in a same direction, from two opposite side edges of the base board, the mounting board perpendicularly extends outward from a side edge of the first connecting board away from the base board, wherein the base board and the first and second connecting boards together define the receiving space.

2. The cabinet of claim 1, wherein each second mounting bracket is rotatably attached to the corresponding first connecting board, each second mounting bracket comprises a rectangular base plate, a first L-shaped connecting plate, and a second L-shaped connecting plate perpendicularly extending from two opposite side edges of the base plate in opposite directions, and a mounting plate extending in a direction perpendicular to the base plate and away from the base plate.

3. The cabinet of claim 2, wherein in the first position, the second connecting plate of the second mounting bracket is latched by a buckling member attached to the second connecting board of the first mounting bracket, in the second position, the second connecting plate of the second mounting bracket is fastened to the mounting board of the first mounting bracket.

4. The cabinet of claim 2, wherein each adjusting assembly further comprises a connecting member rotatably attached to the first mounting bracket, wherein the connecting member is a rectangular board, and wherein when in the first position, the connecting member is parallel to the base board of the first mounting bracket, and wherein when in the second position, the connecting member is perpendicular to the base board.

5. The cabinet of claim 3, wherein the buckling member is attached to the first connecting board of the first mounting bracket, the buckling member comprises an L-shaped buckling portion, and wherein when in the first position, the buckling portion deformably buckles the second connecting plate.

6. The cabinet of claim 4, wherein the first mounting bracket and the connecting member are rotatably attached to the first mounting bracket by hinges.

7. The cabinet of claim 6, wherein the hinge comprises a shaft, and wherein two sheets are rotatably attached to the shaft, wherein one of the two sheets of the hinge is fastened to the first connecting board and the other of the two sheets is fastened to the mounting plate, or one of the two sheets of the hinge is fastened to the base board and the other of the two sheets is fastened to the connecting member.

8. The cabinet of claim 6, wherein the hinge comprises a shaft, and wherein two sheets are rotatably attached to the shaft, wherein one of the two sheets of the hinge is fastened to the base board and the other of the two sheets is fastened to the connecting member, an opening is defined in the connecting member for receiving the corresponding hinge.

* * * * *